(12) United States Patent
Chan et al.

(10) Patent No.: US 9,752,251 B2
(45) Date of Patent: Sep. 5, 2017

(54) SELF-LIMITING SELECTIVE EPITAXY PROCESS FOR PREVENTING MERGER OF SEMICONDUCTOR FINS

(71) Applicant: International Business Machines Corporation, Armonk, NY (US)

(72) Inventors: Kevin K. Chan, Staten Island, NY (US); Eric C. Harley, Lagrangeville, NY (US); Yue Ke, Fishkill, NY (US); Annie Levesque, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 116 days.

(21) Appl. No.: 13/862,759

(22) Filed: Apr. 15, 2013

(65) Prior Publication Data

US 2014/0308782 A1    Oct. 16, 2014

(51) Int. Cl.

| H01L 21/84 | (2006.01) |
| C30B 25/04 | (2006.01) |
| H01L 29/66 | (2006.01) |
| H01L 21/02 | (2006.01) |
| C30B 25/14 | (2006.01) |
| C30B 29/52 | (2006.01) |

(52) U.S. Cl.
CPC .............. *C30B 25/04* (2013.01); *C30B 25/14* (2013.01); *H01L 21/0243* (2013.01); *H01L 21/0262* (2013.01); *H01L 21/02433* (2013.01); *H01L 21/02532* (2013.01); *H01L 21/02576* (2013.01); *H01L 21/02579* (2013.01); *H01L 21/02639* (2013.01); *H01L 21/845* (2013.01); *H01L 29/66795* (2013.01); *C30B 29/52* (2013.01)

(58) Field of Classification Search
CPC ........... H01L 21/823821; H01L 21/845; H01L 21/823418; H01L 21/823814; H01L 29/785; H01L 29/7853; H01L 29/66795; H01L 29/41791; H01L 29/7831; H01L 29/41783; H01L 29/7842; H01L 29/7848
See application file for complete search history.

(56) References Cited

U.S. PATENT DOCUMENTS

| 6,174,806 | B1 * | 1/2001 | Thakur | ............. H01L 21/28518 257/E21.165 |
| 7,772,097 | B2 * | 8/2010 | Tomasini et al. | ............ 438/505 |
| 7,915,693 | B2 * | 3/2011 | Okano | ............. H01L 29/66795 257/329 |

(Continued)

*Primary Examiner* — William F Kraig
*Assistant Examiner* — Sun M King
(74) *Attorney, Agent, or Firm* — Scully, Scott, Murphy & Presser, P.C.; Steven J. Meyers, Esq.

(57) ABSTRACT

A self-limiting selective epitaxy process can be employed on a plurality of semiconductor fins such that the sizes of raised active semiconductor regions formed by the selective epitaxy process are limited to dimensions determined by the sizes of the semiconductor fins. Specifically, the self-limiting selective epitaxy process limits growth of the semiconductor material along directions that are perpendicular to crystallographic facets formed during the selective epitaxy process. Once the crystallographic facets become adjoined to one another or to a dielectric surface, growth of the semiconductor material terminates, thereby preventing merger among epitaxially deposited semiconductor materials.

25 Claims, 10 Drawing Sheets

(56) References Cited

U.S. PATENT DOCUMENTS

| | | | |
|---|---|---|---|
| 8,263,451 B2* | 9/2012 | Su et al. | 438/197 |
| 8,310,013 B2* | 11/2012 | Lin et al. | 257/401 |
| 8,362,575 B2* | 1/2013 | Kwok et al. | 257/401 |
| 8,659,032 B2* | 2/2014 | Chao et al. | 257/77 |
| 8,796,093 B1* | 8/2014 | Cheng et al. | 438/268 |
| 8,946,791 B2* | 2/2015 | Basker | H01L 29/66795 257/288 |
| 9,159,834 B2* | 10/2015 | Cheng | H01L 29/7853 |
| 2007/0145487 A1* | 6/2007 | Kavalieros et al. | 257/368 |
| 2008/0001171 A1* | 1/2008 | Tezuka | H01L 21/823807 257/191 |
| 2012/0280250 A1* | 11/2012 | Basker et al. | 257/77 |
| 2013/0069128 A1* | 3/2013 | Okano | 257/288 |
| 2013/0153960 A1* | 6/2013 | Yang | H01L 23/5252 257/183 |
| 2013/0200455 A1* | 8/2013 | Lo et al. | 257/347 |
| 2014/0061734 A1* | 3/2014 | Basker | H01L 29/66795 257/288 |
| 2014/0134814 A1* | 5/2014 | Wong et al. | 438/283 |
| 2014/0175543 A1* | 6/2014 | Glass et al. | 257/337 |
| 2014/0217362 A1* | 8/2014 | Ma et al. | 257/14 |
| 2014/0217517 A1* | 8/2014 | Cai et al. | 257/401 |
| 2014/0264279 A1* | 9/2014 | Cheng | H01L 29/7853 257/27 |

\* cited by examiner

FIG. 5C　　　　FIG. 5D

SELF-LIMITING SELECTIVE EPITAXY PROCESS FOR PREVENTING MERGER OF SEMICONDUCTOR FINS

BACKGROUND

The present disclosure generally relates to a method of forming a semiconductor structure, and particularly to a method of performing selective epitaxy of a semiconductor material on semiconductor surfaces in a self-limiting manner.

Some semiconductor devices require a plurality of semiconductor fins including epitaxially deposited semiconductor material portions and not merged among one another. For example, a fin field effect transistor may include a plurality of semiconductor fins. Raised active semiconductor regions (such as raised source regions and raised drain regions) can be formed on physically exposed semiconductor surfaces of the plurality of semiconductor fins after formation of a gate electrode and a gate spacer. In such cases, the raised active semiconductor regions on a neighboring pair of semiconductor fins should not be in physical contact with each other to prevent electrical shorting between the neighboring pair of semiconductor fins.

Due to inherent variations in the pitch, the shapes, and the surface conditions of the semiconductor fins, the rate of growth of epitaxially deposited material in the raised active regions is difficult to control with uniformity, and therefore, merging between neighboring raised active semiconductor regions can occur statistically. Such a merger between neighboring raised active semiconductor materials can result in formation of high growth rate facets, i.e., facets that induce epitaxial deposition at a high growth rate. A significant amount of semiconductor material can be deposited due to deposition on high growth rate facets, thereby providing an undesirable conductive path between neighboring semiconductor fins. Thus, a method for preventing accidental formation of undesirable conductive path between neighboring semiconductor fins is desired.

BRIEF SUMMARY

A self-limiting selective epitaxy process can be employed on a plurality of semiconductor fins such that the sizes of raised active semiconductor regions formed by the selective epitaxy process are limited to dimensions determined by the sizes of the semiconductor fins. Specifically, the self-limiting selective epitaxy process limits growth of the semiconductor material along directions that are perpendicular to crystallographic facets formed during the selective epitaxy process. Once the crystallographic facets become adjoined to one another or to a dielectric surface, growth of the semiconductor material terminates, thereby preventing merger among epitaxially deposited semiconductor materials.

According to an aspect of the present disclosure, a method of manufacturing a semiconductor structure is provided. At least one semiconductor fin including a first single crystalline semiconductor material is provided on a substrate. A plurality of faceted semiconductor material portions including a second single crystalline semiconductor material are grown on semiconductor surfaces of the at least one semiconductor fin by flowing at least one reactant precursor for the second single crystalline semiconductor material and an etchant in a selective epitaxy process performed in a process chamber for a duration of time. Growth of the plurality of faceted semiconductor material portions stops when all of physically exposed surfaces of the plurality of faceted semiconductor material portions become faceted surfaces having crystallographically equivalent orientations.

DETAILED DESCRIPTION

As stated above, the present disclosure relates to a method of performing selective epitaxy of a semiconductor material on semiconductor surfaces in a self-limiting manner. Aspects of the present disclosure are now described in detail with accompanying figures. It is noted that like reference numerals refer to like elements across different embodiments. The drawings are not necessarily drawn to scale. The drawings are not necessarily drawn to scale. As used herein, ordinals such are employed to distinguish similar elements, and a same element may be labeled with different ordinals across the specification and the claims.

Figure 1A:
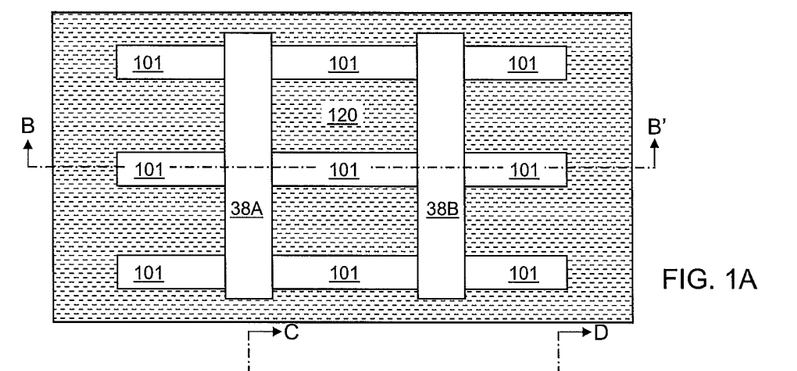
FIG. 1A is a top-down view of an exemplary semiconductor structure after formation of semiconductor fins and gate stack structures according to an embodiment of the present disclosure.
Figure 1B:
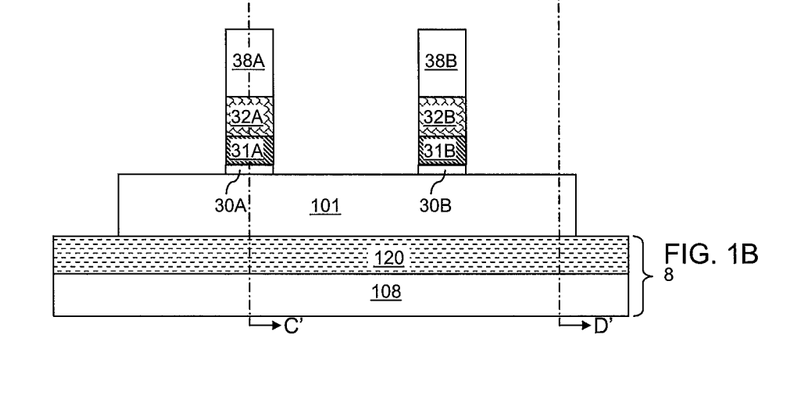
FIG. 1B is a vertical cross-sectional view of the exemplary semiconductor structure along the vertical plane B-B' of FIG. 1A.
Figure 1C:
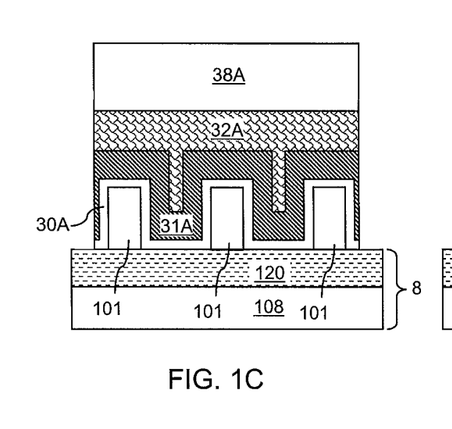
FIG. 1C is a vertical cross-sectional view of the exemplary semiconductor structure along the vertical plane C-C' of FIG. 1B.
Figure 1D:
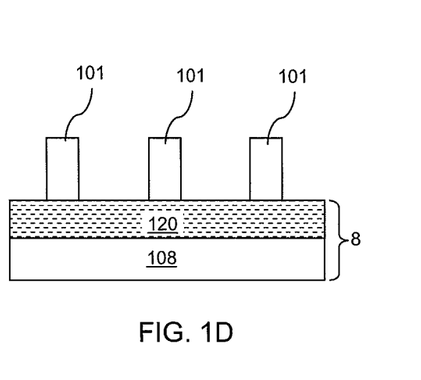
FIG. 1D is a vertical cross-sectional view of the exemplary semiconductor structure along the vertical plane D-D' of FIG. 1B.

Referring to FIGS. 1A-1D, an exemplary semiconductor structure according to an embodiment of the present disclosure includes a substrate 8, at least one semiconductor fin 101 located on the substrate 8, and gate stack structures formed across the at least one semiconductor fin 101. The substrate 8 can include an insulator layer 120 and a handle substrate 108. The insulator layer 120 includes a dielectric material such as silicon oxide, silicon nitride, silicon oxynitride, or a combination thereof. The handle substrate 108 can include a semiconductor material, a conductive material, a dielectric material, or a combination thereof, and provides mechanical support to the insulator layer 120 and the structures thereupon.

The at least one semiconductor fin 101 includes a semiconductor material, which is herein referred to as a first single crystalline semiconductor material. The first single crystalline semiconductor material can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the at least one semiconductor fin 101 is single crystalline. In one embodiment, the at least one semiconductor fin 101 can be a plurality of semiconductor fins 101. In one embodiment, the at least one semiconductor fin 101 can include a single crystalline silicon material, which can be intrinsic single crystalline silicon, p-doped single crystalline silicon, or n-doped single crystalline silicon.

The at least one semiconductor fin 101 can be formed, for example, by providing a semiconductor-on-insulator (SOI) substrate including vertical stack of the handle substrate 108, the insulator layer 120 (which is a buried insulator layer), and a top semiconductor layer including the first single crystalline semiconductor material. The top semiconductor layer is patterned by a combination of lithographic methods and an anisotropic etch to form the at least one semiconductor fin 101. The at least one semiconductor fin 101 can be formed directly on the top surface of the insulator layer 120.

In one embodiment, each of the at least one semiconductor fin 101 can include a pair of vertical sidewalls that extend along a lengthwise direction the semiconductor fin 101. As used herein, a "lengthwise direction" of an object is a direction along which the moment of inertia of the object becomes a minimum. The lengthwise direction of the at least one semiconductor fin 101 can be a horizontal direction. In one embodiment, the at least one semiconductor fin 101 can be a plurality of semiconductor fins 101 having a same horizontal lengthwise direction, i.e., the lengthwise directions of the plurality of semiconductor fins 101 can be parallel among each other and parallel to an interface between the insulator layer 120 and the plurality of semiconductor fins 101.

Gate stack layers can be subsequently deposited over the at least one semiconductor fin 101 and on the physically exposed portions of the top surface of the substrate 8. The gate stack layers can include a stack, from bottom to top, of a gate dielectric layer, at least one gate conductor layer, and optionally, a gate cap dielectric layer. Each of the gate stack layers can be a conformal material layer, i.e., can have a uniform thickness throughout. Gate stack structures are formed by patterning the gate stack layers. For example, the gate stack layers can be patterned by an anisotropic etch process employing a patterned photoresist (not shown) as a masking layer to form the gate stack structures, each including a gate dielectric, a gate conductor, and optionally, a gate cap dielectric.

In an illustrative example, a first gate stack structure and a second gate stack structure can be formed. The first gate stack structure can include a first gate dielectric 30A, a first lower gate conductor portion 31A, a first upper gate conductor portion 32A, and a first gate cap dielectric 38A. The second gate stack structure can include a second gate dielectric 30B, a second lower gate conductor portion 31B, a second upper gate conductor portion 32B, and a second gate cap dielectric 38B.

The gate dielectric layer, and consequently, each of the first and second gate dielectrics (30A, 30B), can include a dielectric material, which can be silicon oxide, silicon nitride, silicon oxynitride, or a stack thereof. Alternately or additionally, the gate dielectric layer, and consequently, each of the first and second gate dielectrics (30A, 30B), can include a high dielectric constant (high-k) material layer having a dielectric constant greater than 3.9. In one embodiment, the gate dielectric layer can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer can be from 0.9 nm to 6 nm, although lesser and greater thicknesses can also be employed.

The gate conductor layer can be a single layer or a plurality of layers. In one embodiment, the gate conductor layer can include a lower gate conductor layer from which the first and second lower gate conductor portions are patterned (31A, 31B) and an upper gate conductor layer from which the first and second upper gate conductor portions (32A, 32B) are patterned. The gate conductor layer, and consequently, each of the first and second lower gate conductor portions (31A, 31B) and each of the first and second upper gate conductor portions (32A, 32B), can include a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten. The thickness of the gate conductor layer can be from 20 nm to 200 nm, although lesser and greater thicknesses can also be employed. In a non-limiting illustrative example, the first and second lower gate conductor portions (31A, 31B) can include a workfunction material, and the first and second upper gate conductor portions (32A, 32B) can include a doped semiconductor material.

If a gate cap dielectric layer is formed, the gate cap dielectric layer, and consequently, the first and second gate cap dielectric portions (38A, 38B) derived therefrom, can include a dielectric material such as silicon nitride, silicon oxide, organosilicate glass (OSG), a high dielectric constant (high-k) material layer that can be employed for the gate dielectric layer, or a combination thereof. The gate cap dielectric layer can be deposited, for example, by chemical vapor deposition or by any other deposition method known in the art. The thickness of the gate cap dielectric layer, if present, can be from 10 nm to 200 nm, and typically from 20 nm to 100 nm, although lesser and greater thicknesses can also be employed.

A photoresist layer is applied over the gate stack layers and is lithographically patterned. The pattern in the photoresist layer is transferred through the gate stack layers, for example, by an anisotropic that employs the patterned photoresist layer as an etch masks and employs the gate dielectric layer as an etch stop layer. Subsequently, physically exposed portions of the gate dielectric layer can be removed by an isotropic etch, which can be, for example, a wet etch.

Figure 2A:
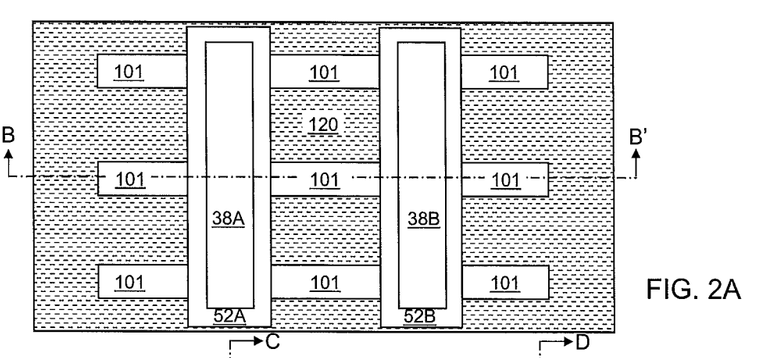
FIG. 2A is a top-down view of the exemplary semiconductor structure after formation of gate spacers according to an embodiment of the present disclosure.
Figure 2B:
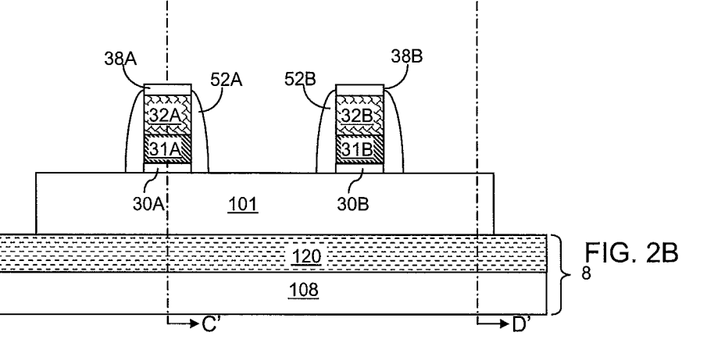
FIG. 2B is a vertical cross-sectional view of the exemplary semiconductor structure along the vertical plane B-B' of FIG. 2A.
Figure 2C:
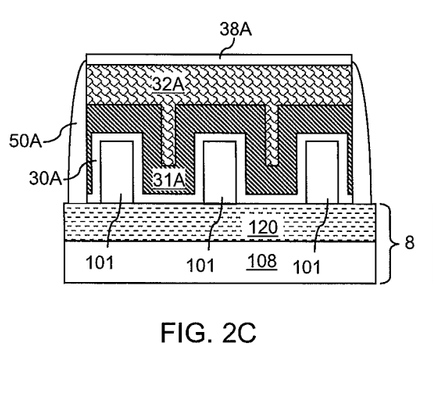
FIG. 2C is a vertical cross-sectional view of the exemplary semiconductor structure along the vertical plane C-C' of FIG. 2B.
Figure 2D:
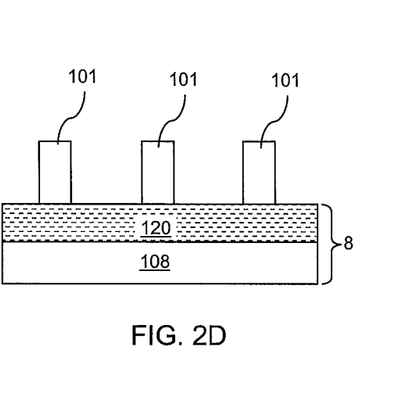
FIG. 2D is a vertical cross-sectional view of the exemplary semiconductor structure along the vertical plane D-D' of FIG. 2B.

Referring to FIGS. 2A-2D, gate spacers (52A, 52B) can be formed around the gate stack structures by deposition of a conformal dielectric material layer and an anisotropic etch. Vertical portions of the conformal dielectric material layer are removed during the anisotropic etch, and remaining horizontal portions of the conformal dielectric material layer constitute the gate spacers (52A, 52B). The gate spacers (52A, 52B) can include, for example, a first gate spacer 52A that laterally surrounds the first gate stack structure (30A, 31A, 32A, 38A) and a second gate spacer 52B that laterally surrounds the second gate stack structure (30B, 31B, 32B, 38B). The gate spacers (52A, 52B) can include a dielectric material such as silicon nitride, silicon oxynitride, silicon oxide, organosilicate glass, or a combination thereof. The thickness of the gate spacers (52A, 52B), as measured at the base of the gate spacers (52A, 52B), can be from 5 nm to 100 nm, although lesser and greater thicknesses can also be employed.

Figure 3A:
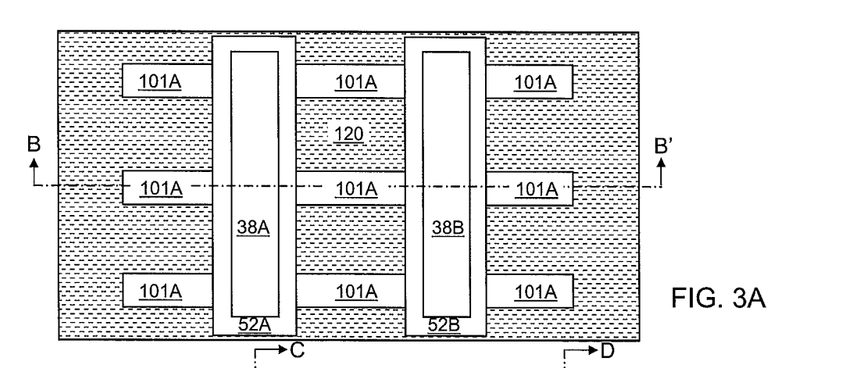
FIG. 3A is a top-down view of the exemplary semiconductor structure after formation of active semiconductor regions by implantation of electrical dopants according to an embodiment of the present disclosure.
Figure 3B:
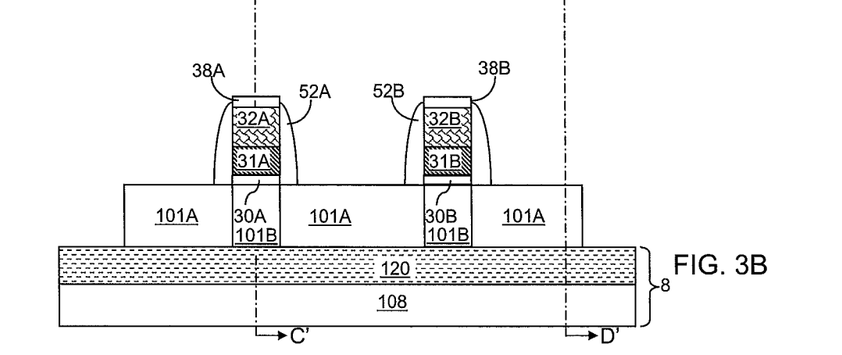
FIG. 3B is a vertical cross-sectional view of the exemplary semiconductor structure along the vertical plane B-B' of FIG. 3A.
Figure 3C:
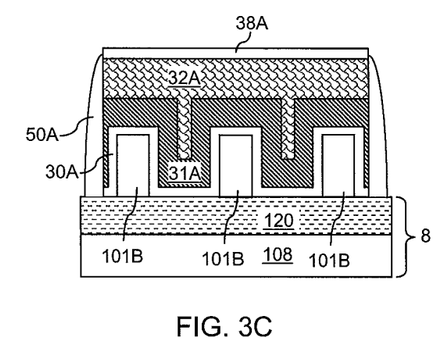
FIG. 3C is a vertical cross-sectional view of the exemplary semiconductor structure along the vertical plane C-C' of FIG. 3B.
Figure 3D:
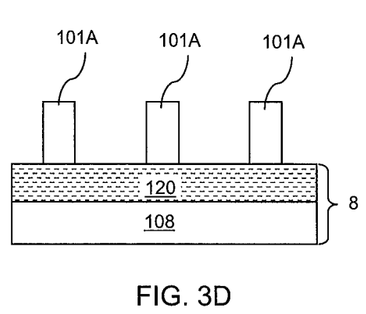
FIG. 3D is a vertical cross-sectional view of the exemplary semiconductor structure along the vertical plane D-D' of FIG. 3B.

Referring to FIGS. 3A-3D, active semiconductor regions 101A can be formed within portions of each of the at least one semiconductor fin 101 by implantation of electrical dopants. As used herein, an "active semiconductor region" refers to any semiconductor region that functions as an electrical node of a semiconductor device. Examples of active semiconductor regions include, but are not limited to, as a source region of a field effect transistor, a drain region of a field effect transistor, and a source/drain region of a field effect transistor that is configured to function as a source region or a drain region depending on the mode of operation of a semiconductor circuit including the field effect transistor. Each unimplanted portions of the at least one semiconductor fin 101 can constitute a body region 101B. As used herein, "electrical dopants" refer to any dopants selected from p-type dopants and n-type dopants. Exemplary p-type dopants include B, Ga, and In, and exemplary n-type dopants include P, As, and Sb.

In one embodiment, a source region (one of the active semiconductor regions 101A) and a drain region (another of the active semiconductor regions 101A) can be formed within end portions of each of the at least one semiconductor fin 101. In this case, the source region and the drain region are laterally spaced from each other by a body region 101B that underlies a gate stack structure.

In one embodiment, formation of the active semiconductor regions 10A by ion implantation of electrical dopants can be postponed until after formation of raised active semiconductor regions.

Figure 4A:
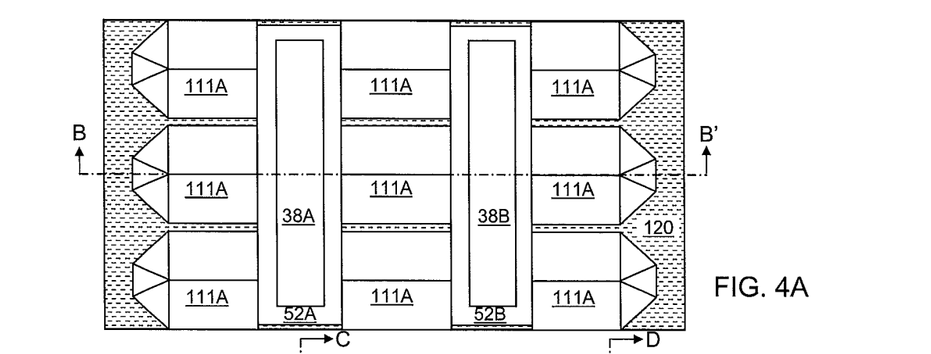
FIG. 4A is a top-down view of the exemplary semiconductor structure after formation of raised active semiconductor regions according to an embodiment of the present disclosure.
Figure 4B:
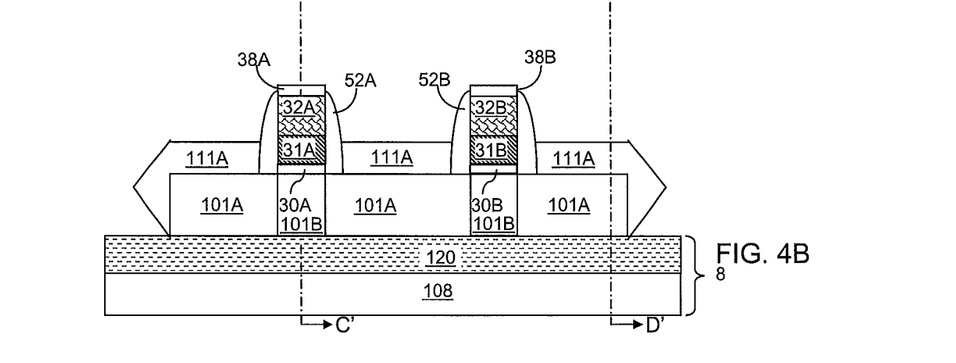
FIG. 4B is a vertical cross-sectional view of the exemplary semiconductor structure along the vertical plane B-B' of FIG. 4A.
Figure 4C:
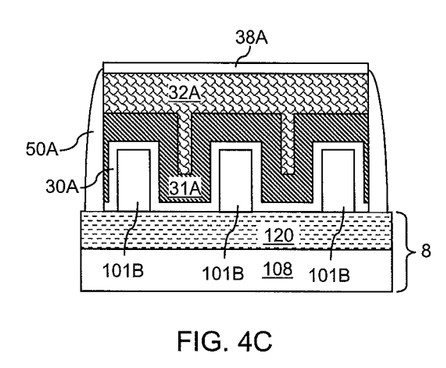
FIG. 4C is a vertical cross-sectional view of the exemplary semiconductor structure along the vertical plane C-C' of FIG. 4B.
Figure 4D:
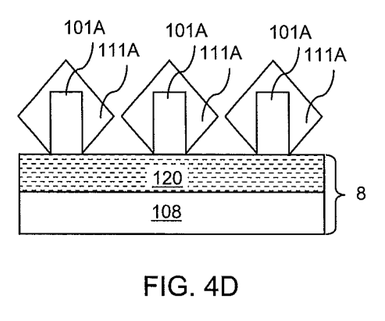
FIG. 4D is a vertical cross-sectional view of the exemplary semiconductor structure along the vertical plane D-D' of FIG. 4B.

Referring to FIGS. 4A-4D, a plurality of faceted semiconductor material portions 111A is grown on physically exposed surfaces of the at least one semiconductor fin (101A, 101B). The plurality of faceted semiconductor material portions 111A includes a second single crystalline semiconductor material, and grows directly on semiconductor surfaces of the at least one semiconductor fin (101A, 101B). In one embodiment, physically exposed surfaces of each faceted semiconductor material portion 111A can consist of crystallographic facets of the second single crystalline semiconductor during the growth of the plurality of faceted semiconductor material portions 111A.

In one embodiment, a selective epitaxy process can be employed to grow the plurality of faceted semiconductor material portions 111A. During the selective epitaxy process, the exemplary semiconductor structure including physically exposed surfaces of the at least one semiconductor fin (101A, 101B) are loaded into a process chamber, and at least one reactant precursor for the second single crystalline semiconductor material and an etchant are flowed into the process chamber. The flow rate of the at least one reactant precursor for the second single crystalline semiconductor material and the flow rate of the etchant can be time-invariant (i.e., constant as a function of time), or can be modulated as a function of time.

The flow rate of the at least one reactant precursor for the second single crystalline semiconductor material and the flow rate of the etchant are selected such that the deposition of the second single crystalline semiconductor material proceeds selectively, i.e., proceeds on semiconductor surfaces and does not proceed on dielectric surfaces. Specifically, the etch rate for any semiconductor material that may nucleate on dielectric surfaces is grater than the rate of growth of a seed semiconductor material for nucleation on the dielectric surfaces is etched immediately, and does not result in a sustainable mechanism. As such, the at least one reactant precursor does not nucleate on any dielectric surface during the selective epitaxy process.

Further, the flow rate of the at least one reactant precursor for the second single crystalline semiconductor material and the flow rate of the etchant are selected such that a set of crystallographically equivalent orientations exists along which a net deposition rate of the second single crystalline semiconductor material is either zero or negative. In one embodiment, the flow rate of the at least one reactant precursor for the second single crystalline semiconductor material and the flow rate of the etchant are selected such that a set of crystallographically equivalent orientations exists along which a net deposition rate of the second single crystalline semiconductor material zero. As used herein, a "net deposition rate" refers to the difference between a deposition rate of a material due to all reactants in a process chamber and an etch rate of the material due to all etchants in the process chamber. Under such conditions, the growth of the plurality of faceted semiconductor material portions 111A stops when all of physically exposed surfaces of the plurality of faceted semiconductor material portions become faceted surfaces having crystallographically equivalent orientations within the set. Under such conditions, all of the physically exposed surfaces of the plurality of faceted semiconductor material portions become adjoined to one another or to one or more dielectric surfaces.

In one embodiment, the faceted surfaces having the crystallographically equivalent orientations contact one another or one or more dielectric surfaces once the growth of the plurality of faceted semiconductor material portions 111A stops. In one embodiment, the plurality of faceted semiconductor material portions 111A can be deposited on all surfaces of the at least one pair of vertical sidewalls of the at least one semiconductor fin (101A, 101B). In one embodiment, each of the faceted surfaces can become adjoined to at least another of the faceted surfaces no later than when the growth of the plurality of faceted semiconductor material portions 111A stops. As used herein, a first surface adjoins a second surface when an edge of the first surface coincides with an edge of the second surface.

In one embodiment, the ratio of the flow of the at least one reactant precursor to the flow of the etchant is maintained such that the growth of the second single crystalline semiconductor material proceeds along crystallographic orientations other than the set of crystallographically equivalent orientations along which the net deposition rate of the second single crystalline semiconductor material is either zero or negative. The selective epitaxy process can be performed in a process chamber for a duration of time, and the growth of the plurality of faceted semiconductor material portions 111A can stop when all of physically exposed surfaces of the plurality of faceted semiconductor material portions become faceted surfaces having crystallographically equivalent orientations prior to termination of the duration of time. Continued exposure of the exemplary semiconductor structure to the combination of the at least one reactant precursor for the second single crystalline semiconductor material and the etchant after the growth of the plurality of faceted semiconductor material portions 111A stop does not cause deposition of any additional semiconductor material. In one embodiment, the plurality of faceted semiconductor material portions 111A does not change in size after the growth of the plurality of faceted semiconductor material portions 111A stops. In another embodiment, the plurality of faceted semiconductor material portions 111A can decrease in size after the growth of the plurality of faceted semiconductor material portions stops.

In one embodiment, the faceted surfaces of the plurality of faceted semiconductor material portions 111A are not parallel to, or perpendicular to, the top surface of the insulator layer 120. In one embodiment, the crystallographically equivalent orientations of the faceted surface of the plurality of faceted semiconductor material portions 111A are {111} orientations. As used herein, {hkl}, in which each of h, k, and l represents independent integers, orientations refer to a set of crystallographic orientations that are equivalent to a {111} orientation by crystal symmetry of a single crystalline material.

In one embodiment, the top surface(s) of the at least one semiconductor fin (101A, 101B) can include one of {001} surfaces and sidewalls of the at least one semiconductor fin (101A, 101B) can include {110} surfaces or {100} surfaces. In this case, the crystallographically equivalent orientations of the faceted surface of the plurality of faceted semiconductor material portions 111A can be {111} orientations.

In another embodiment, the top surface(s) of the at least one semiconductor fin (101A, 101B) can include one of {110} surfaces and sidewalls of the at least one semiconductor fin (101A, 101B) can include {001} surfaces or {110} surfaces. In this case, the crystallographically equivalent orientations of the faceted surface of the plurality of faceted semiconductor material portions 111A can be {111} orientations.

In yet another embodiment, the top surface(s) of the at least one semiconductor fin (101A, 101B) can include one of {001} surfaces and sidewalls of the at least one semiconductor fin (101A, 101B) can include {100} surfaces. In this case, the crystallographically equivalent orientations of the faceted surface of the plurality of faceted semiconductor material portions 111A can be {111} orientations.

In one embodiment, the second single crystalline semiconductor material can be a single crystalline silicon-germanium alloy. In one embodiment, an atomic concentration of germanium in the second single crystalline semiconductor material can be in a range from 10% to 50%.

In one embodiment, the first single crystalline semiconductor material can include silicon at an atomic concentration of at least 90%. In one embodiment, the first single crystalline semiconductor material can be doped or undoped silicon, or a doped or undoped silicon-germanium alloy in which the atomic concentration of silicon is at least 90%. In one embodiment, the first single crystalline semiconductor material can consist of silicon or consist of silicon and at least one electrical dopant.

In one embodiment, the at least one reactant precursor can include at least one silicon-containing precursor and at least one germanium-containing precursor. For example, the at least one silicon-containing precursor can include at least one of $SiH_4$, $SiH_2Cl_2$, $SiHCl_3$, $SiCl_4$, and $Si_2H_6$, and the at least one germanium-containing precursor can include at least one of $GeH_4$ and $Ge_2H_6$. The etchant can include HCl.

In one embodiment, the molar ratio of the at least one reactant precursor (i.e., all of the at least one reactant precursor) to the etchant is in a range from 4:1 to 1:4 in the process chamber during the selective epitaxy process. The pressure of the selective epitaxy process is maintained in a range that provides differential growth rates for different crystallographic surfaces of the second single crystalline semiconductor material. In one embodiment, the partial pressure of the etchant can be in a range from 1 mTorr to 10 Torr, and the partial pressure of all of the at least one reactant precursor is in a range from 1 mTorr to 5 Torr, although lesser and greater partial pressures can also be employed for the etchant and/or the at least one reactant precursor.

At least one carrier gas may optionally be employed. Exemplary gases that may be employed as a carrier gas include, but are not limited to, hydrogen, nitrogen, helium, and argon. The total pressure in the process chamber can be in a range from 3 Torr to 300 Torr, although lesser and greater total pressures can also be employed.

The temperature of the process chamber during the selective epitaxy process can be in a range from 600° C. to 800° C., although lesser and greater temperatures can also be employed.

In an illustrative example, the selective epitaxy may be performed employing a set of process parameters that include:

total pressure: in a range from 3 Torr to 300 Torr;
SiH$_2$Cl$_2$ partial pressure: in a range from 1 mTorr to 5 Torr;
GeH$_4$ partial pressure: in a range from 1 mTorr to 5 Torr;
HCl partial pressure: in a range from 1 mTorr to 10 Torr;
H$_2$ partial pressure: in a range from 1 mTorr to 10 Torr;
B$_2$H$_6$, PH$_3$, AsH$_3$, or SbH$_3$ (if employed) partial pressure: in a range from 0 Torr to 1 Torr; and temperature: in a range from 600° C. to 800° C.

In another illustrative example, the selective epitaxy may be performed employing a set of process parameters that include:
total pressure: in a range from 3 Torr to 300 Torr;
SiH$_4$ partial pressure: in a range from 1 mTorr to 5 Torr;
GeH$_4$ partial pressure: in a range from 1 mTorr to 5 Torr;
HCl partial pressure: in a range from 1 mTorr to 10 Torr;
H$_2$ partial pressure: in a range from 1 mTorr to 10 Torr;
B$_2$H$_6$, PH$_3$, AsH$_3$, or SbH$_3$ (if employed) partial pressure: in a range from 0 Torr to 1 Torr; and temperature: in a range from 600° C. to 800° C.

In one embodiment, the at least one semiconductor fin (101A, 101B) can be a plurality of semiconductor fins (101A, 101B). In this case, the lateral spacing among the plurality of semiconductor fins (101A, 101B) and the growth of the plurality of faceted semiconductor material portions 111A can be controlled such that faceted semiconductor material portions 111A formed on different semiconductor fins (101A, 101B) do not contact each other. In this case, a subset of the plurality of faceted semiconductor material portions 111A that are formed directly on one of the plurality of semiconductor fins (101A, 101B) does not contact any other subset of the plurality of faceted semiconductor material portions 111A that are formed directly on any other of the plurality of semiconductor fins (101A, 101B). This feature can be advantageously employed to prevent electrically shorting a plurality of semiconductor fins (101A, 101B) while providing an additional semiconductor material to each semiconductor fin (101A, 101B) through selective epitaxy of the second single crystalline semiconductor material.

In one embodiment, the plurality of faceted semiconductor material portions 111A can be formed with in-situ doping of at least one electrical dopant. In this case, the plurality of faceted semiconductor material portions 111A can include p-type dopants or n-type dopants. Additionally or alternatively, ion implantation of electrical dopants may be performed into the plurality of the faceted semiconductor material portions 111A employing masked ion implantation or employing unmasked ion implantation. If formation of the active semiconductor regions 101A is not performed at the processing steps of FIGS. 3A-3D, ion implantation steps employed to introduce electrical dopants into the plurality of the faceted semiconductor material portions 111A may be employed to simultaneously form the active semiconductor regions 101A at this step.

Additionally or alternatively, an anneal at an elevated temperature may be optionally employed to outdiffuse electrical dopants introduced into the plurality of the faceted semiconductor material portions 111A into portions of the at least one semiconductor fin to form active semiconductor regions 101A (if the active semiconductor regions 101A are not formed at the processing steps of FIGS. 3A-3D), or to add additional electrical dopants to the active semiconductor regions 101A (if the active semiconductor regions 101A are formed at the processing steps of FIGS. 3A-3D). The temperature of the anneal can be, for example, in a range from 600° C. to 1,100° C. Further, an anneal at an elevated temperature may be optionally employed to outdiffuse electrical dopants in the active semiconductor regions 101A into the plurality of faceted semiconductor material portions 111A. The temperature of the anneal can be, for example, in a range from 600° C. to 1,100° C.

In one embodiment, a source region (i.e., a contiguous set of an active semiconductor region 101A and a set of faceted semiconductor material portions 111A) and a drain region (i.e., another contiguous set of an active semiconductor region 101A and a set of faceted semiconductor material portions 111A) can be formed within end portions of each contiguous set of the at least one semiconductor fin (101A, 101B) and the plurality of faceted semiconductor material portions 111A. The source region and the drain region can be laterally spaced from each other by a body region 101B underlying a gate stack structure.

In one embodiment, an anneal at an elevated temperature can be optionally employed to interdiffuse semiconductor materials across interfaces between the at least one semiconductor fin (101A, 101B) and the plurality of faceted semiconductor material portions 111A. The temperature of the anneal can be, for example, in a range from 800° C. to 1,100° C. In this case, the semiconductor materials in the plurality of semiconductor fins 2 and the plurality of faceted semiconductor material portions 4 can be partially, or completely, homogenized.

Each contiguous set of a semiconductor fin (101A, 101B) and faceted semiconductor material portions 111A can collectively constitute a semiconductor nanowire. As used herein, a "semiconductor nanowire" refers to a contiguous semiconductor material portion that extends along a lengthwise direction and having a maximum lateral dimension (the greatest of any dimension perpendicular to the lengthwise dimension) that does not exceed 100 nm. Each semiconductor nanowire (101A, 101B, 111A) includes a region (e.g., a body region 101B) of a lesser cross-sectional area in a plane perpendicular to the lengthwise direction, and a region (e.g., a region including an active semiconductor region 101A and faceted semiconductor material portions 111A in direct contact with the active semiconductor region 101A) of a greater vertical cross-sectional area in a plane perpendicular to the lengthwise direction. Thus, each semiconductor nanowire (101A, 101B, 111A) can have at least two regions having different cross-sectional areas in planes perpendicular to the lengthwise direction.

Figure 5A:
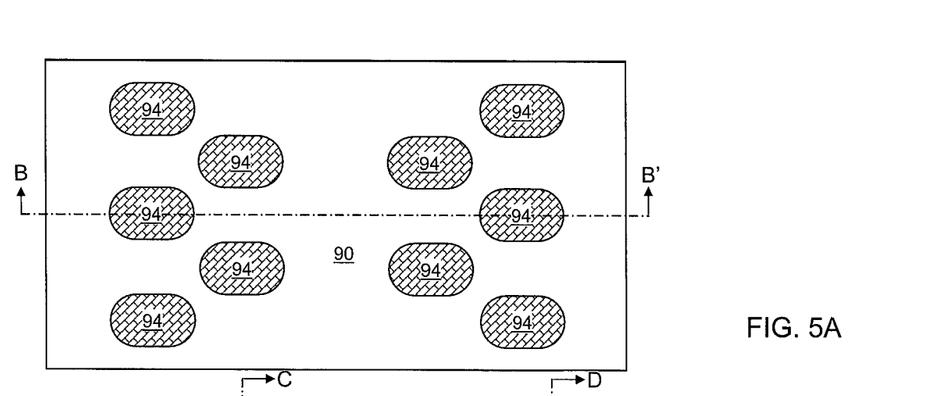
FIG. 5A is a top-down view of the exemplary semiconductor structure after formation of a contact-level dielectric layer and contact via structures according to an embodiment of the present disclosure.
Figure 5B:
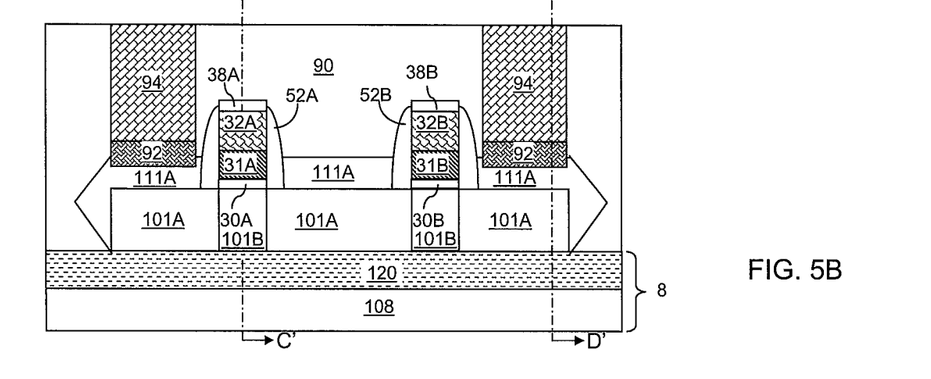
FIG. 5B is a vertical cross-sectional view of the exemplary semiconductor structure along the vertical plane B-B' of FIG. 5A.
Figure 5C:
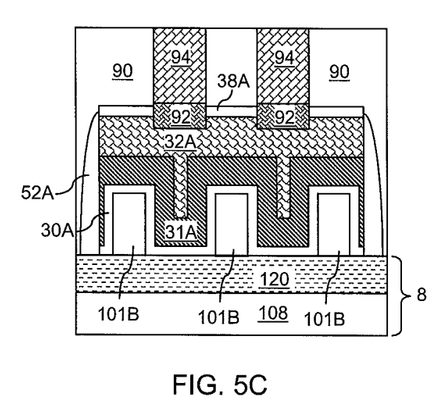
FIG. 5C is a vertical cross-sectional view of the exemplary semiconductor structure along the vertical plane C-C' of FIG. 5B.
Figure 5D:
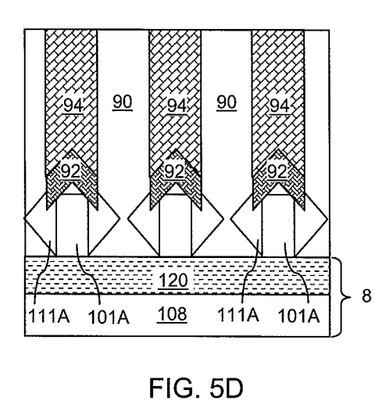
FIG. 5D is a vertical cross-sectional view of the exemplary semiconductor structure along the vertical plane D-D' of FIG. 5B.

Referring to FIGS. 5A-5D, a contact-level dielectric material layer 90 may be formed over the at least one semiconductor nanowire (101A, 101B, 111A) and the gate stack structures. Via cavities can be formed through the contact-level dielectric material layer 90, and can be filled with contact via structures 94. Optionally, metal semiconductor alloy portions 92 can be formed on surfaces of the faceted semiconductor material portions 111A by reacting a metal with surface portions of the second single crystalline semiconductor material prior to formation of the contact via structures 94. Embodiments are expressly contemplated herein, in which the gate stack structures include disposable materials, and are replaced with replacement gate materials (including a gate dielectric material and a gate electrode material).

The methods of the present disclosure can be employed to form raised source regions and raised drain regions while preventing merger among a plurality of raised source regions on different semiconductor fins and merger among a plurality of raised drain region on different semiconductor fins due to the self-liming growth of the faceted semiconductor material portions.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A method of forming a semiconductor structure comprising:
   providing at least one semiconductor fin including a first single crystalline semiconductor material on a substrate;
   growing a plurality of faceted semiconductor material portions including a second single crystalline semiconductor material on semiconductor surfaces of said at least one semiconductor fin by flowing at least one reactant precursor for said second single crystalline semiconductor material and an etchant in a selective epitaxy process performed in a process chamber for a duration of time, wherein a flow rate of said at least one reactant precursor and a flow rate of said etchant are selected to provide a set of crystallographically equivalent orientations in which a net deposition rate of said second single crystalline semiconductor material is either zero or negative thereby growth of said plurality of faceted semiconductor material portions stops when all of physically exposed surfaces of said plurality of faceted semiconductor material portions become faceted surfaces having crystallographically equivalent orientations within said set of crystallographically equivalent orientations;
   forming a contact-level dielectric material surrounding each semiconductor fin and in direct contact with a bottom portion of said faceted semiconductor material portions, wherein said contact-level dielectric material has contact openings;
   forming a metal semiconductor alloy portion within said contact openings and directly on an upper surface of said faceted semiconductor material portions, wherein a bottom surface and a top surface of said metal semiconductor alloy portion are faceted; and
   forming a contact via structure directly on said faceted upper surface of metal alloy portion, wherein outermost vertical sidewalls of said metal semiconductor alloy portion are vertically aligned with outermost vertical sidewalls of said contact via structure.

2. The method of claim 1, wherein all of said physically exposed surfaces of said plurality of faceted semiconductor material portions become adjoined to one another or to one or more dielectric surfaces.

3. The method of claim 1, wherein said faceted surfaces having said crystallographically equivalent orientations contact one another or one or more dielectric surfaces.

4. The method of claim 1, wherein said substrate comprises an insulator layer, and said at least one semiconductor fin is formed directly on a top surface of said insulator layer.

5. The method of claim 4, wherein said faceted surfaces are not parallel to, or perpendicular to, said top surface of said insulator layer.

6. The method of claim 1, wherein said crystallographically equivalent orientations are {111} orientations.

7. The method of claim 1, wherein each of said at least one semiconductor fin includes a pair of vertical sidewalls that extend along a lengthwise direction, and said plurality of faceted semiconductor material portions are deposited on all surfaces of said at least one pair of vertical sidewalls.

8. The method of claim 1, wherein each of said faceted surfaces becomes adjoined to at least another of said faceted surfaces no later than when said growth of said plurality of faceted semiconductor material portions stops.

9. The method of claim 1, wherein said plurality of faceted semiconductor material portions does not change in size after said growth of said plurality of faceted semiconductor material portions stops.

10. The method of claim 1, wherein said plurality of faceted semiconductor material portions decreases in size after said growth of said plurality of faceted semiconductor material portions stops.

11. The method of claim 1, wherein said second single crystalline semiconductor material is a single crystalline silicon-germanium alloy.

12. The method of claim 11, wherein an atomic concentration of germanium in said second single crystalline semiconductor material is in a range from 10% to 50%.

13. The method of claim 11, wherein said first single crystalline semiconductor material includes silicon at an atomic concentration of at least 90%.

14. The method of claim 13, wherein said first single crystalline semiconductor material consists of silicon or consists of silicon and at least one electrical dopant.

15. The method of claim 1, wherein said at least one reactant precursor comprises at least one silicon-containing precursor and at least one germanium-containing precursor.

16. The method of claim 15, wherein said at least one silicon-containing precursor comprises at least one of $SiH_4$, $SiH_2Cl_2$, $SiHCl_3$, $SiCl_4$, and $Si_2H_6$.

17. The method of claim 15, wherein said at least one germanium-containing precursor comprises at least one of $GeH_4$ and $Ge_2H_6$.

18. The method of claim 1, wherein said etchant comprises HCl.

19. The method of claim 1, wherein a molar ratio of said at least one reactant precursor to said etchant is in a range from 4:1 to 1:4 in said process chamber during said selective epitaxy process.

20. The method of claim 1, wherein a partial pressure of said etchant is in a range from 1 mTorr to 10 Torr, and a partial pressure of all of said at least one reactant precursor is in a range from 1 mTorr to 5 Torr.

21. The method of claim 1, wherein said at least one reactant precursor does not nucleate on any dielectric surface during said selective epitaxy process.

22. The method of claim 1, wherein said at least one semiconductor fin is a plurality of semiconductor fins, and a subset of said plurality of faceted semiconductor material portions that are formed directly on one of said plurality of semiconductor fins does not contact any other subset of said plurality of faceted semiconductor material portions that are formed directly on any other of said plurality of semiconductor fins.

23. The method of claim 1, further comprising interdiffusing semiconductor materials across said at least one semiconductor fin and said plurality of faceted semiconductor material portions by an anneal at an elevated temperature.

24. The method of claim 1, further comprising forming a gate stack structure across said at least one semiconductor fin prior to performing said selective epitaxy process, wherein said gate stack structure includes a stack of a gate dielectric and a gate electrode.

25. The method of claim 24, further comprising forming a source region and a drain region within end portions of each contiguous set of said at least one semiconductor fin and said plurality of faceted semiconductor material portions, wherein said source region and said drain region are laterally spaced from each other by a body region underlying said gate stack structure.

\* \* \* \* \*